United States Patent [19]
Reynolds et al.

[11] Patent Number: 5,395,249
[45] Date of Patent: Mar. 7, 1995

[54] SOLDER-FREE BACKPLANE CONNECTOR

[75] Inventors: John C. Reynolds, Hanover, Pa.; Robert A. Bourdelaise, Gambrills; Bruce N. Lenderking, Pasadena, both of Md.

[73] Assignee: Westinghouse Electric Corporation, Pittsburgh, Pa.

[21] Appl. No.: 70,139

[22] Filed: Jun. 1, 1993

[51] Int. Cl.$^6$ ............................................. H05K 1/00
[52] U.S. Cl. ............................................. 439/65; 439/66
[58] Field of Search .................... 439/7, 66, 77, 91, 65

[56] References Cited

U.S. PATENT DOCUMENTS

| | | |
|---|---|---|
| 3,982,320 | 9/1976 | Buchoff et al. |
| 4,029,375 | 6/1977 | Gabrielian ............... 439/66 OR |
| 4,445,735 | 5/1984 | Bonnefoy ............... 436/66 OR |
| 4,506,938 | 3/1985 | Madden . |
| 4,597,617 | 7/1986 | Enochs . |
| 4,729,166 | 3/1988 | Lee et al. . |
| 4,933,808 | 6/1990 | Horton et al. . |
| 4,961,709 | 10/1990 | Noschese ............... 439/66 OR |
| 5,014,161 | 5/1991 | Lee et al. . |
| 5,092,774 | 3/1992 | Milan ............... 439/66 OR |
| 5,127,837 | 7/1992 | Shah et al. ............... 439/66 X |
| 5,214,563 | 5/1993 | Estes ............... 439/91 X |

Primary Examiner—David L. Pirlot
Assistant Examiner—Daniel Wittels

[57] ABSTRACT

A backplane connector system for electrically interconnecting an electronic module to a backplane assembly using a solder-free technique is described. A plurality of mating pads of conductive material are positioned on the surface of the backplane as a system interface. A corresponding series of plunger contacts are embedded in rows of cavities within a single connector body. At least one button spring having an elastic response to deformation is positioned within the cavities and touches the plunger contacts. The connector body, which has a variety of configurations, is attached to either the electronic module or to the backplane assembly. Upon installation of the electronic module into the backplane assembly, the plunger contacts depress into the button springs. The elastic response of the button springs holds the connection in compression and forms a compliant, solder-free, electrical interface.

8 Claims, 12 Drawing Sheets

SOLDER-FREE BACKPLANE CONNECTOR

BACKGROUND OF THE INVENTION

1. Field of the Invention

The present invention relates generally to electrical connectors, and more particularly to a connector for electrically interconnecting a plurality of terminals of an electronic module to corresponding terminals of a backplane assembly.

2. Discussion of Related Art

Connectors for electrically connecting electronic modules to a backplane assembly typically comprise a connector body of insulative material attached to a backplane surface. These connectors have a slotted opening that runs longitudinally through the center of the connector body with V-shaped contacts positioned within the slotted opening. When a board edge from an electronic module is inserted into the slotted opening in the connector body, interface circuit paths on the board engage with the V-shaped contacts to complete the interface between the module and the backplane.

Backplane connectors for applications requiring a higher contact density comprise two halves of insulative material. One half is attached to a module, while a second mating half is attached to the backplane surface. Individual contacts of conductive material are embedded in the body of each half connector. Typically, the contacts in one connector half are shaped as rectangular blades. The corresponding contacts in the other connector half are then shaped as tuning forks. The transverse axes of the two sets of contacts are arranged 90 degrees apart from each other. In this way, each rectangular blade enters the crotch of a corresponding tuning fork when the two connector halves are forced together. The contacts are dimensioned such that the connection forms a frictional bond that is reliable and gas-tight.

Throughholes are generally used to pass the connector contacts through the backplane. Throughholes are drilled into the module and the backplane in a pattern that aligns with the contact pattern on the connector halves. The non-mating ends of the contacts on each connector half are then inserted in the throughholes. On the backplane, the contacts are secured through a press fit. On the module, contacts are typically attached by soldering, a tedious and labor intensive operation. A polarized pin and key arrangement usually secures each connector half mechanically to the module or the backplane. The contacts may be connected as desired by wire-wrapping the non-mating ends of the contacts. Alternatively, the throughholes may be plated and connections between contacts made by plating circuit paths on the backplane.

Conventional connectors for backplanes have several drawbacks. The contact mating technique for connectors having two halves of insulative material makes module insertion and extraction difficult. When a rectangular blade contact mates with a tuning fork contact, the bond formed is highly frictional. The mated contacts are particularly resistant to axial forces of stress and strain. Individual contact engagement often requires a force of up to 2.25 ounces. For a backplane connector having 396 contacts, the connector mating force may approach 50 pounds. Consequently, the addition or removal of a module from a backplane requires the use of extraction and insertion tools. These tools generally apply a force at the back edge of the module with a lever technique.

The tuning fork and rectangular contacts in conventional backplane connectors are also highly susceptible to misalignment and damage. Exact alignment between each of the several hundred rectangular blades and tuning forks is necessary for the connector halves to match. When repeated making and breaking of the contacts occurs over time, bending of some contacts is likely, which may eventually lead to contact damage. Contact damage renders the module, backplane, or both useless until the damaged contacts are repaired. Even slight misalignment between one pair of corresponding contacts will increase the required insertion and extraction forces. Misalignment can prevent the installation of a module. Repeated engagement can also lead to contact surface corrosion due to the wiping action of the blade in the tuning fork. This corrosion may eventually increase contact resistance.

Moreover, the passing of contacts through the backplane via throughholes limits the contact density in the prior art. Grid spacing for backplane throughholes for a conventional connector is generally limited to 0.10 inches by 0.05 inches. Practical limitations such as the size of the contacts inserted into the throughholes, the need to maintain the structural integrity of the backplane, and the spacing required between throughholes for circuit paths prohibit increasing the contact density for existing designs. The soldering of several hundred contacts to the plated throughholes is also labor intensive and tedious.

In light of the foregoing, there is a need for a backplane connector for interconnecting electronic modules that minimizes the need for insertion and extraction tools, lowers the risk of contact damage, permits a higher interconnect density, comprises fewer assembled parts, and requires less assembly labor.

SUMMARY OF THE INVENTION

Accordingly, the present invention is directed to a backplane connector that substantially obviates one or more of the limitations and disadvantages of the described prior arrangements.

Additional advantages of the invention will be set forth in the description that follows, and in part will be apparent from the description, or may be learned by practice of the invention. The advantages of the invention will be realized and attained by the apparatus and combination particularly pointed out in the written description and claims hereof as well as the appended drawings.

To achieve these and other objects and advantages and in accordance with the purpose of the invention, as embodied and broadly described herein, the invention is a device for electrically connecting terminals of an electronic module to terminals of a backplane, where the device includes an insulative body having a plurality of surfaces extending at an angle to one another. The insulative body has a plurality of orifices, each spaced to communicate at one end with one of the surfaces and at an opposite end with another of the surfaces, and the orifice ends are spaced to align with corresponding terminals of the module and backplane to be connected. The device includes an electrically conductive button spring inserted in each orifice and at least one electrically conductive member slidably mounted in each orifice having one end engaging the corresponding button spring and an opposite end protruding from one of the surfaces of the body. Each of the members is forced further into each respective orifice against the urging of the respective button spring at times when the corresponding member is in physical engagement with an opposing terminal of one of the backplane and module.

In another aspect, the invention is a combination including a backplane assembly having a plurality of terminals of conductive material for electrically connecting to an electronic module, an electronic module having a plurality of terminals of conductive material and being positioned within the backplane assembly, and a device for electrically connecting the terminals of the backplane assembly to corresponding terminals of the electronic module. The device includes an insulative body having a plurality of surfaces extending at an angle to one another, where the body has a plurality of orifices. Each orifice is spaced to communicate at one end with one of the surfaces and at an opposite end with another of the surfaces, and the orifice ends are spaced to align with corresponding terminals of the module and backplane to be connected. The device also includes an electrically conductive button spring inserted in each orifice, and at least one electrically conductive member slidably mounted in each orifice having one end engaging the corresponding button spring and an opposite end protruding from one of the surfaces of the body. Each of the members is forced further into each respective orifice against the urging of the respective button spring at times when the corresponding member is in physical engagement with an opposing terminal of one of the backplane and module.

It is understood that both the foregoing general description and the following detailed description are exemplary and explanatory and are intended to provide further explanation of the invention as claimed.

The accompanying drawings, which are incorporated in and constitute a part of this specification, illustrate several embodiments of the invention and together with the description serve to explain the principles of the invention.

DETAILED DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1:
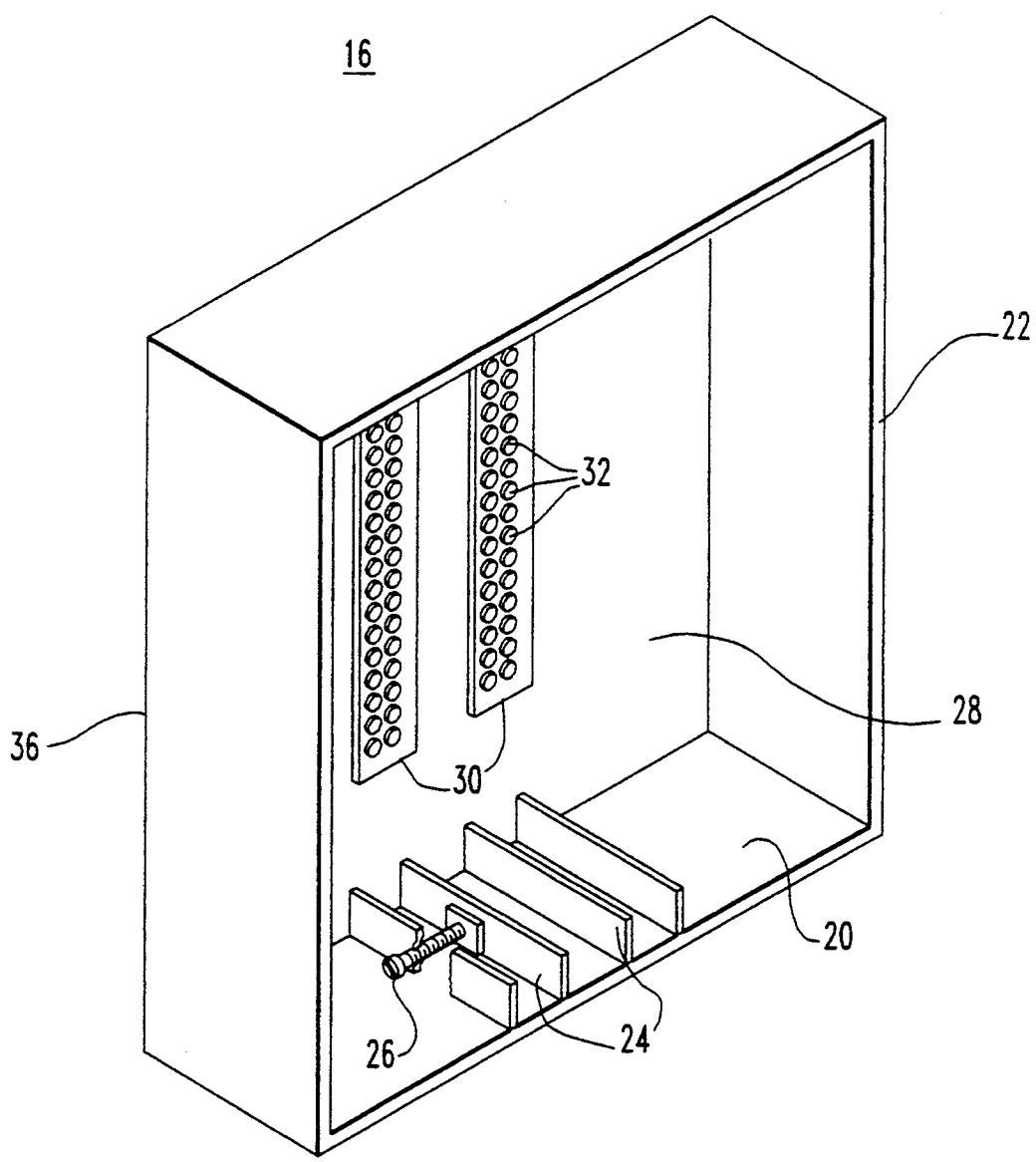
FIG. 1 is a perspective view of a backplane assembly for use with the present invention.
Figure 2:
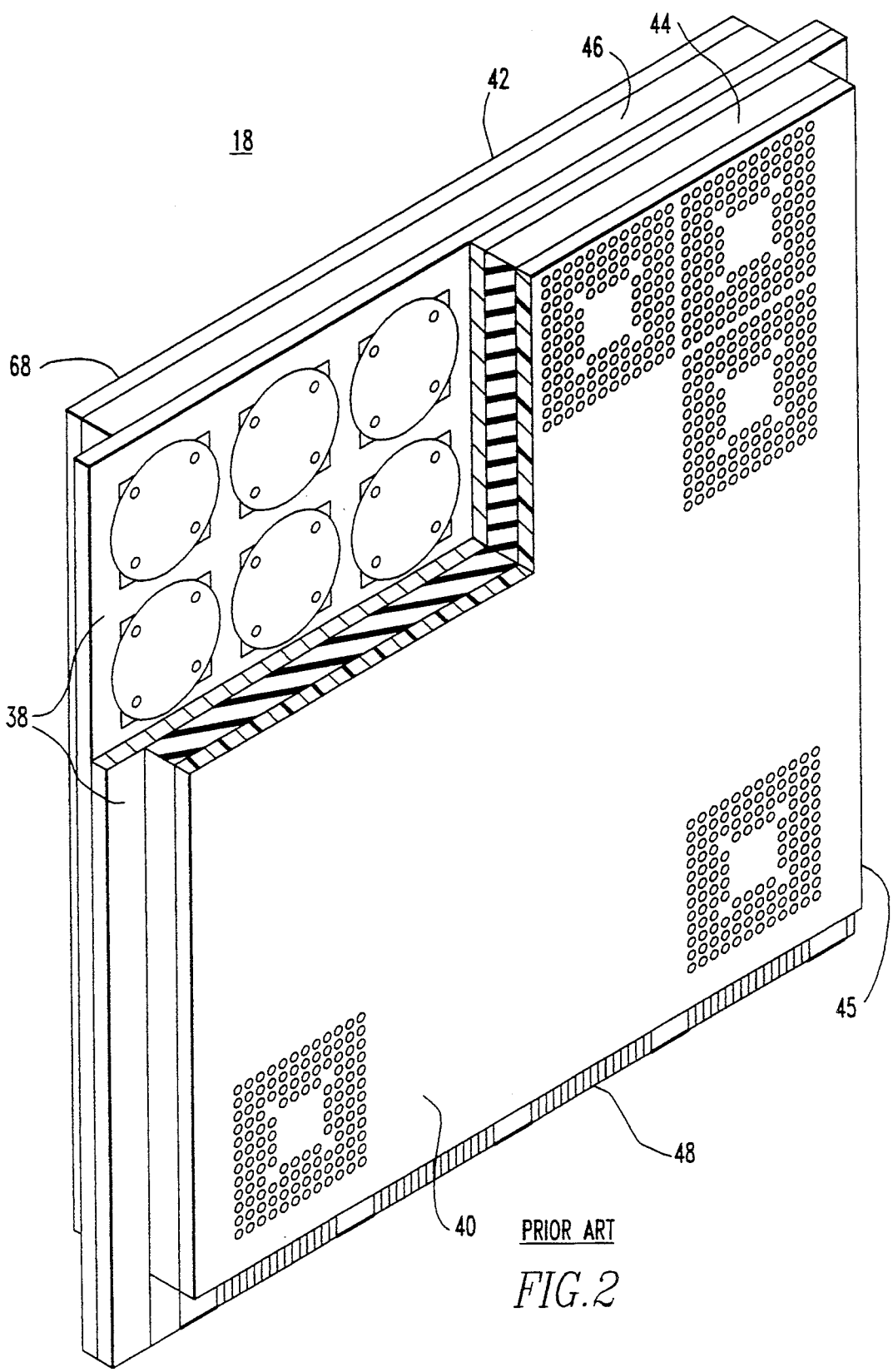
FIG. 2 is a perspective view of a high power electronic module for use with the present invention.

FIG. 1 shows an example of a backplane assembly 16. One purpose of the backplane assembly 16 is to secure mechanically a series of electronic modules for an electronic system. Typically, an electronic module 18, as shown in FIG. 2, comprises at least one planar, rectangular, printed wiring board. At least one mounting surface 20 of the backplane assembly 16 is arranged at an angle, generally 90 degrees, to a backplane 22. Mounting guides 24 are dispersed along the mounting surface 20. As is readily known in the art, each mounting guide 24 contains two parallel walls positioned perpendicular to the mounting surface and set apart by a distance slightly greater than the thickness of module 18. Each mounting guide 24 serves as a slide for guiding a module 18 into contact with the backplane 22 upon installation. Typically, the mounting guides 24 are arranged on the mounting surface 20 so as to permit a series of planar modules to slide into the backplane assembly 16 in parallel alignment. Such an arrangement maximizes the number of modules per backplane assembly and increases the effectiveness of convection cooling for the modules. Further, the mounting guides 24 serve to secure a module installed into the backplane assembly 16. Particularly, a conventional module retainer 26 is situated within each mounting guide 24 or an electronic module 18.

The module retainer 26 includes a screw operated mechanism for securing a module 18 within a backplane assembly 16. When the screw mechanism is tightened, the module retainer 26 expands and forces the installed module 18 firmly against the mounting guide 24.

Figure 8:
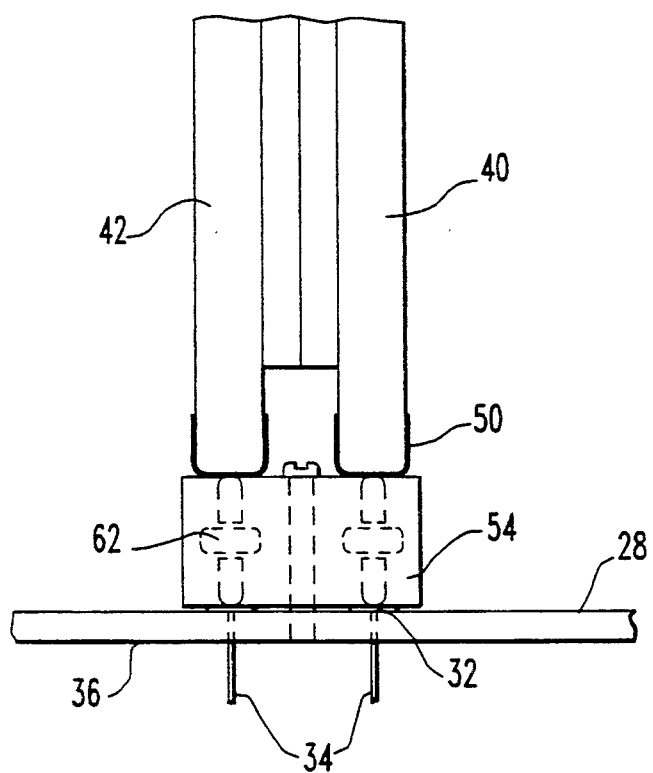
FIG. 8 is a fragmentary view of an electronic module installed in a backplane assembly using a connector according to the first embodiment of the present invention.

Interior surface 28 of the backplane 22 contains a series of connector regions 30. Within each connector region 30, a plurality of mating pads 32 of conductive material are arranged. Each mating pad 32 serves as the contact for passing an electrical signal to and from an installed module 18. The mating pads 32 may be formed by conductive plating, for example. Individual mating pads 32 may be electrically connected to each other through means commonly known to those of ordinary skill in the art, preferably through electroplated hardwiring across a surface of the backplane 22. The mating pads 32 may contain tails 34 that protrude through exterior surface 36 of the backplane 16, as shown in FIG. 8. In this arrangement, the tails 34 and the corresponding mating pads 32 are also connected through electroplating. Wire-wrapping may be used to connect the mating pad tails 34.

As mentioned, an electronic module generally comprises at least one planar, rectangular printed wiring board. Such a module has electrical components connected on at least one surface. For high power applications, a module 18 may be formed by inserting a heat sink 38 of thermally conductive material between two separate printed wiring boards 40 and 42, as shown in FIG. 2. A spacer 44 and 46 of electrically insulative material is located directly between one side of each printed wiring board 40 and 42 and the heat sink 38. Each spacer 44 and 46 permits the conduction of heat to the heat sink 38, while preventing the formation of a short circuit between one of the printed wiring boards 40 or 42 and the heat sink 38.

Figure 3:
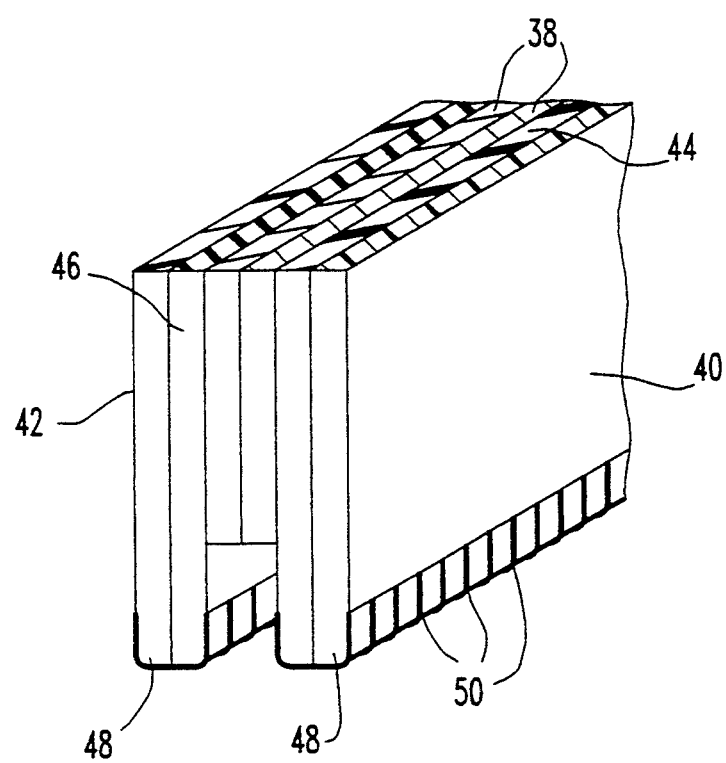
FIG. 3 is a fragmentary, magnified, perspective view of the electronic module shown in FIG. 2.

A back edge 48 of the module 18 contains the electrical interface for the entire board. In a conventional printed wiring board, the interface on the back edge 48 is formed by electroplating a plurality of circuit paths on at least one side of the board. Alternatively, terminals 50 of conductive material may be mounted on the back edge 48 of the printed wiring boards 40 and 42, as shown in FIG. 3. Each terminal 50 is made of an electrical conductor, such as a thin copper sheet, and plated with gold to improve conductivity. The terminals 50 are attached to an insulating material, such as polyamide, with an acrylic or epoxy based adhesive, for example. The insulating material may be attached to the back edge 48 by an adhesive, as is common in the art. Each of the terminals 50 connects with at least one of the circuit paths on the back edge 48 of each printed wiring board 40 and 42. The terminals 50 provide a conductive interface along the end of the back edge 48 as well as on the sides of the back edge 48 of the module 18. Although the terminals 50 must touch the circuit paths on the printed wiring boards 40 and 42, the terminals 50 may also connect with other elements of the module 18, such as a non-conductive spacer 44 or 46 as shown in FIG. 3. Thus, the high power module 18 contains at least two parallel rows of electrical interfacing.

Figure 4:
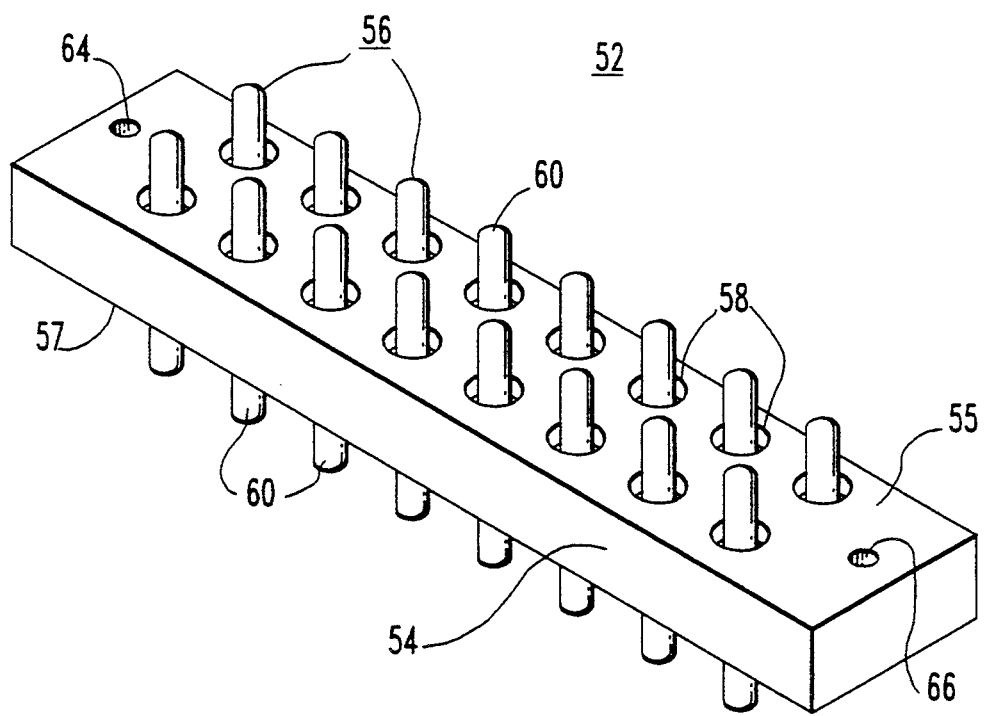
FIG. 4 is a perspective view of a backplane connector according to a first embodiment of the present invention.
Figure 5:
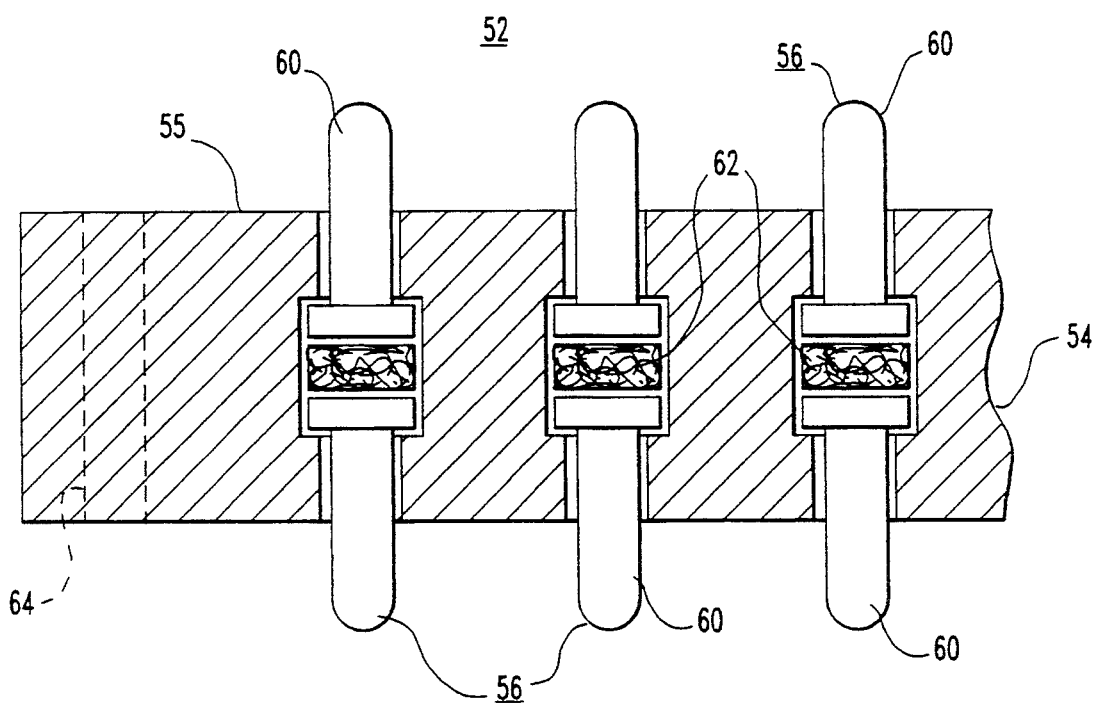
FIG. 5 is a fragmentary sectional view of a backplane connector of the type shown in FIG. 4.

Referring to FIGS. 4 and 5, a backplane connector 52 comprises a connector body 54 and a plurality of conductive assemblies 56. The connector body 54 is composed of electrically insulative material and may be manufactured through conventional molded plastic techniques, for example. Typically, the longitudinal portion of the connector body 54 is rectangular in shape. In the embodiment of FIG. 4, a plurality of orifices 58, or bores, extend linearly through the connector body 54 in communication with two parallel sides 55 or 57. Each of the conductive assemblies 56 is located within one orifice 58 of the connector body 54. As shown in FIG. 5, each of the conductive assemblies 56 comprises a button spring 62 located between two plunger contacts 60, all three items of the conductive assembly 56 being arranged substantially co-linear in a respective orifice 58.

The button springs 62, which are between the plunger contacts 60, are formed from finely woven, electrically conductive wire. The wire is wound and bunched into a wad. The conductive wad, or button spring 62, exhibits elastic characteristics such that the button spring returns to its original shape after being deformed. That is, when compressed, the button spring 62 will assert an opposing tensile force and urge the plunger contacts outwardly to protrude beyond surfaces 55 and 57 of the connector body 54. The wire is generally made of beryllium copper or molybdenum alloy, for example. Button springs 62 are available from the Cinch company under the tradename "CIN-:APSE."

The plunger contacts 60 are preferably cylinder-shaped and constructed of conductive material such as Kovar. To improve conductivity, the plunger contacts are plated with nickel and finished with a gold coating of about 10 microns. Further, each plunger contact 60 may include a shoulder region of enlarged diameter or spring fingers for the purpose of retaining the plunger contact in the cavity 58, as described below.

At least one button spring 62 is positioned near the center of each orifice 58 in the connector body 54. One plunger contact 60 is positioned at one end of each orifice 58 in the connector body 54 such that the plunger contact touches the button spring 62 and also partially protrudes out the connector body 54 through side 55, as shown in FIG. 5. Likewise, a second plunger contact 60 is situated on the opposite side of the button spring 60 and partially protrudes out the opposite side of the connector body 54 through side 57. The width or diameter of the orifices 58 in the connector body 54 and the width or diameter of the plunger contacts 60 are selected so that the plunger contacts fit firmly and slidably into the orifices 58. The plunger contacts 60 should be limited to sliding substantially in the linear direction of the centerline of the orifices 58. Slight friction between the plunger contacts 60 and the walls of the orifices 58 serves to restrict the lateral motion of the plunger contacts.

As shown in FIG. 5, the orifices 58 may be formed having an enlarged diameter within the center of the connector body 54. To install the conductive assembly 56, the connector body 54 may be split or fabricated in two longitudinal halves. The plunger contacts 60 are then inserted in each orifice with the shoulder region of the contact corresponding to the enlarged diameter within the connector body 54. The two longitudinal halves may then be sealed together with a button spring 62 sandwiched between each pair of plunger contacts 60.

Figure 6:
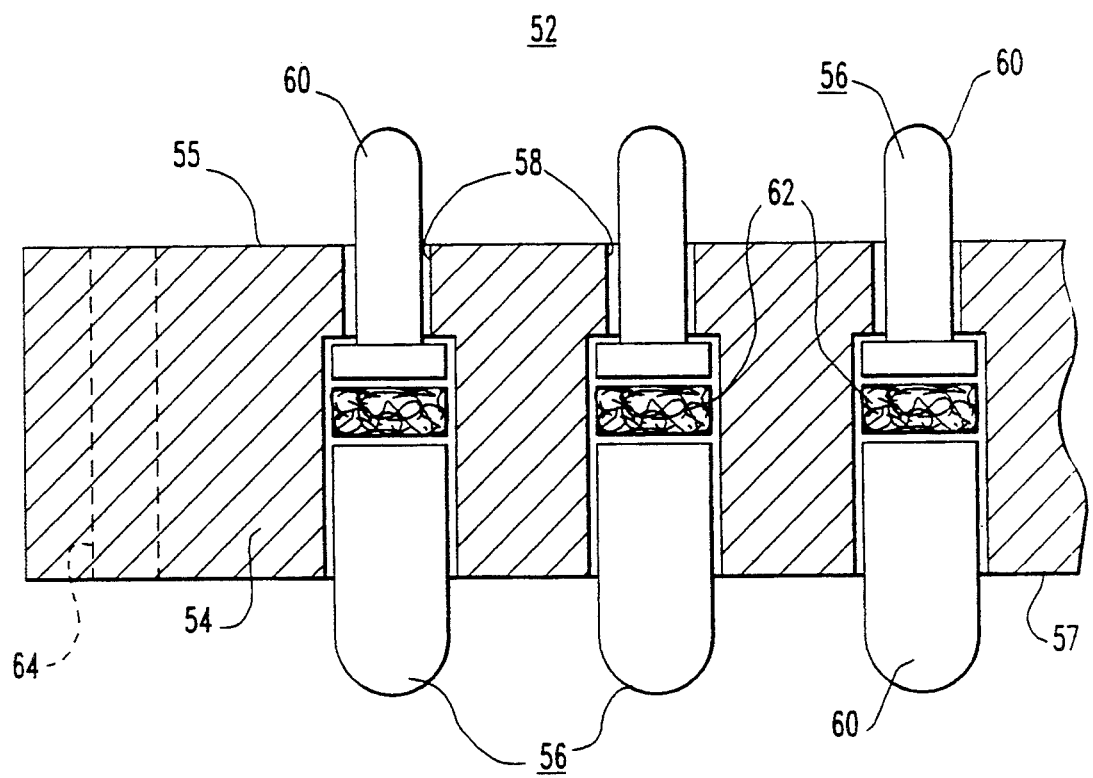
FIG. 6 is a fragmentary sectional view of a backplane connector of the type shown in FIG. 4 only with bores having a portion of reduced diameter.

Alternatively, for applications where the connector is permanently attached to a backplane or a module upon assembly, the increased diameter of the orifice 58 could extend through one side of the connector body, as depicted in FIG. 6. A plunger contact 60 having a shoulder region, a button spring 62, and a plunger contact 60 of a uniform diameter could be inserted in the orifice 58 at the area of increased diameter. The assembled connector 52 would be installed permanently on a backplane or a module to ensure retention of the conductive assembly 56.

Figure 7:
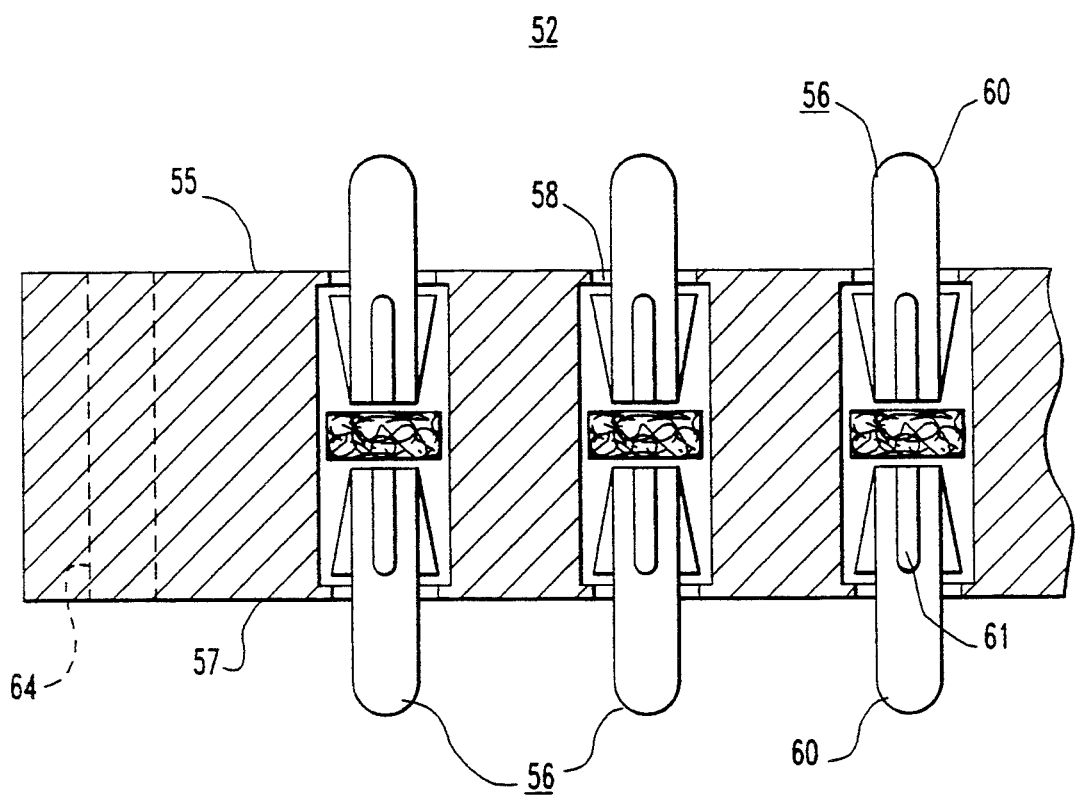
FIG. 7 is a fragmentary sectional view of the backplane connector of the type shown in FIG. 4 with plungers and bores having mating portions for holding the plunger in the bores.

As shown in FIG. 7, spring fingers 61 may be attached to plunger contacts 60 for retention in an orifice having an enlarged center diameter. When the contacts 60 are inserted, the fingers 61 are compressed by the walls of the orifice. As the outer ends of the fingers 61 pass into the enlarged center diameter region, the fingers 61 snap outward from the centerline of the orifice 58 and retain the contacts 60 slidably within the connector body 54. The spring fingers 61 could be made of beryllium copper, for example. Similar retention techniques will be readily apparent to one of ordinary skill in the art.

The backplane connector 52 preferably is mounted directly to a connector region 30 of the backplane 22. Two mounting holes 64 and 66 extend through the connector body 54 parallel to the orifices 58. Mechanical attachment to the backplane assembly 16 may occur through the use of a bolted assembly or a riveted connection, for example. When being mounted to the backplane 22, the backplane connector 52 is first placed in a connector region 30 on the interior surface 28 of the backplane 22 so that the plunger contacts 60 on one side of the connector body 54 align with the corresponding mating pads 32. The connector body is then mechanically attached to the backplane 22 through the mounting holes 64 and 66. As the mechanical attachment forces the backplane connector 52 together with the backplane 22, each of the plunger contacts touching the mating pads 32 moves inwardly in the respective orifice and deforms the button spring 62 positioned inside each orifice 58. The urging of the button springs 62 against the depressed plunger contacts 60 holds the plunger contact-to-mating pad connection in elastic compression.

Installation of a module such as 18 is carried out by inserting a bottom edge 45 of the module 18 into a mounting guide 24 and sliding the back edge 48 of the module toward the backplane 22. The mounting guides 24 help to align the individual plunger contacts 60 protruding from the backplane connector 52, which is attached to the connector region of the interior surface 28 of the backplane 22. When the module 18 meets the backplane connector 52 during installation, the corresponding terminals 50 and plunger contacts 60 connect and form a compliant interface, as shown in FIG. 8. The insertion force provided during installation causes the plunger contacts 60 to depress the button springs 62. The button springs 62 thereby exert a resilient force against the depressed plunger contacts and hold the plunger contact-to-terminal connection in elastic compression. Physically securing the inserted module 18 can occur using methods commonly known in the art, such as through the use of module retainer 26 installed on the backplane assembly guides 24. A module retainer 26 also serves to conduct heat from the heat sink 38 to the backplane assembly 16.

Because the electrical connection achieved does not involve the highly frictional insertion of a contact blade into a tuning fork, the forces required for installing a module are much less for the present invention. Pressure on the front edge 68 of the module 18, often with the assistance of a lever device, is sufficient to complete the electrical connections. Extraction of the module is usually possible without the need for tools. The resilient characteristics of the button springs 62 help to disengage the module 18. Furthermore, the elimination of frictional contact mating greatly reduces the risk of damage or misalignment to the contacts 60 and 62. Engagement of the module 18 to the connector 52, which in turn is connected to backplane 22, can be achieved even if alignment is not precisely perpendicular. Slight deviation from a 90 degree angle between the module 18 and the backplane will still cause depression of the plunger contacts 60, without risk of contact damage. Thus, a reliable electrical connection between a module and a backplane assembly can be achieved using only one connector body.

Moreover, use of mating pads 32 eliminates the need for throughholes in the backplane. As a result, the mating pads 32, and therefore the plunger contacts 60, may be positioned more closely together. If the mating pads 32 are situated so as to equal the maximum contact density of the prior art, the present invention permits each mating pad to accommodate an increased number of circuit paths due to the elimination of throughholes.

Figure 9:
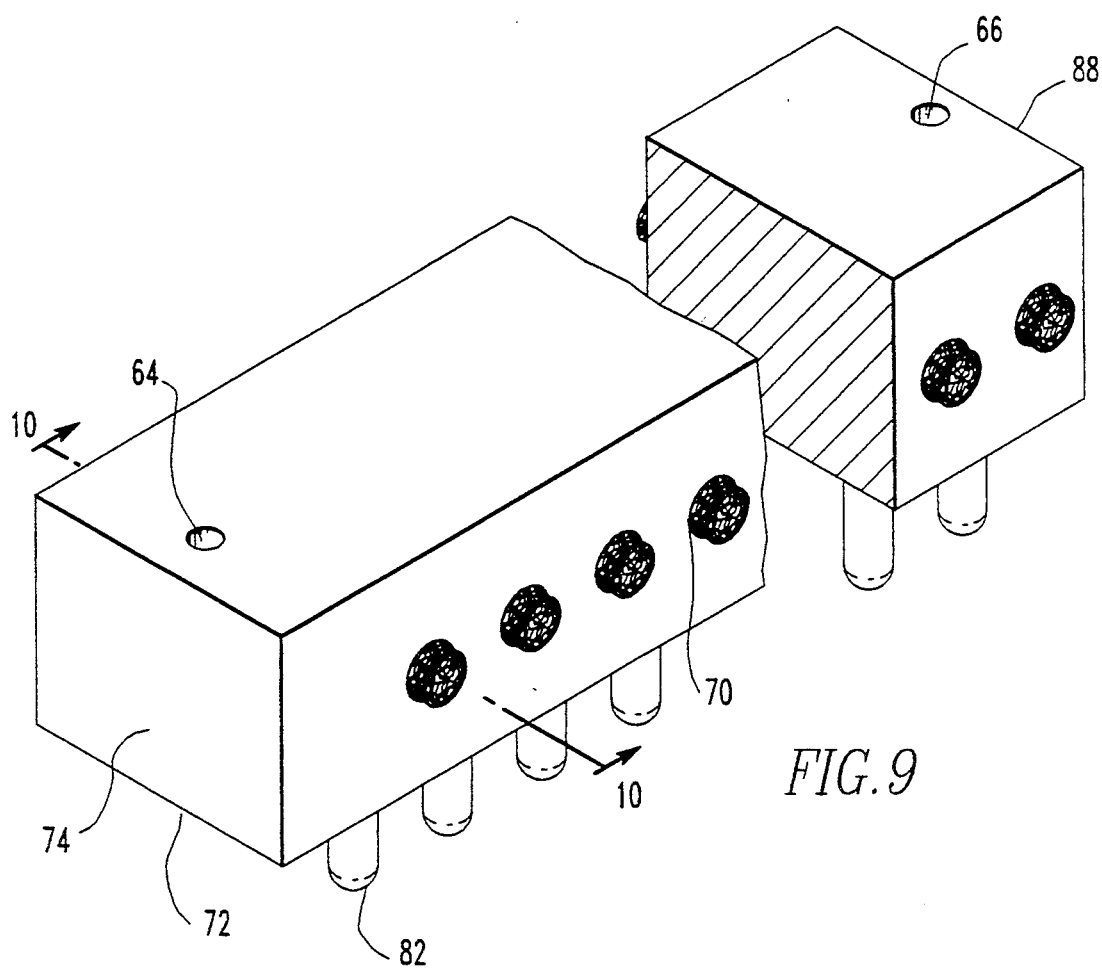
FIG. 9 is a perspective view of a backplane connector according to a second embodiment the present invention.
Figure 10:
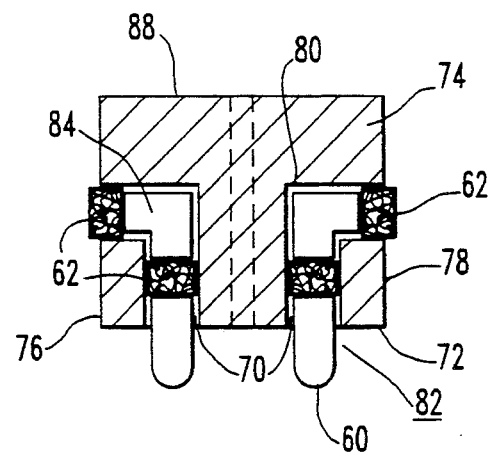
FIG. 10 is a sectional view of the backplane connector of FIG. 9 taken along line 10—10 of FIG. 9.

Referring to FIGS. 9 and 10, a second embodiment of the backplane connector 88 comprises a connector body 74 and a plurality of conductive assemblies 32. The connector body 74 is composed of electrically insulative material and may be manufactured through conventional molded plastic techniques for example. Typically, the longitudinal portion of the connector body 74 is rectangular in shape. As shown in FIG. 10, the connector body 74 has a first longitudinal side 72 substantially perpendicular to a second longitudinal side 76 and a third longitudinal side 78. As a result, the third side 78 is substantially parallel to the second side 76. The width of the connector body 74 between the second side 76 and the third side 78 is slightly smaller than the distance between the printed wiring boards 40 and 42 of a module 18.

In this embodiment, two rows of orifices 70, or bores, begin on the first side 72 of the connector body 74, as shown in FIG. 10. The orifices in one row pass through the interior of the connector body 74 and extend through the second side 76 of the connector body 74. The orifices in the other row pass through the interior of the connector body 74 and extend through the third side 78 of the connector body 74. Where the orifices 70 open through the first side 72 of the connector body 74, the centerlines of the orifices align substantially perpendicular to the surface of that side 72. Likewise, where the orifices 70 open through the second side 76 or third side 78 of the connector body, the centerlines of the orifices align substantially perpendicular to the surface of that second side 76 or third side 78, respectively. As a result, the orifices 70 form an angle 80 within the connector body 74. The angled orifices 70, like the connector body 74, can be made following conventional molded plastic techniques, as is readily known to one of ordinary skill in the art.

A conductive assembly 82 is located within each orifice 70. Each conductive assembly 82 comprises an internal dog leg contact 84 located between two button springs 62, together with one plunger contact 60. When the backplane connector 88 and a module 18 are installed in a backplane assembly 16, each conductive assembly 82 electrically connects a terminal on the back edge 48 of the module 18 with a corresponding mating pad 32 on the interior surface 28 of the backplane 22 (See FIG. 1).

The internal contacts 84, like the plunger contacts 60, are constructed of conductive material and plated with gold. The internal contacts are shaped so as to fill each orifice 70 in the inside of the connector body 74 at and around the angle 80. Typically, the internal contacts 84 will be shaped at a right angle to have perpendicular axes.

Two button springs 62 are located differently in each orifice. An external button spring 62 is positioned at the respective second side 76 or third side 78 end of each orifice 70 such that this button spring 62 touches one end of the internal contact 84 and also partially protrudes out the connector body 74, as shown in FIG. 10. An internal button spring 62 is positioned inside each orifice 70 such that this button spring 62 touches the opposite end of the internal contact 84.

The plunger contacts 60 complete the conductive assembly 82. Each plunger contact 60 is positioned at the first side 72 end of each orifice 70 such that the plunger contact 60 touches the internal button spring 62 and also partially protrudes out the first side 72 of the connector body 74, as shown in FIG. 10. The retention of the conductive assembly 82 in the connector body 74 may be achieved, for example, by using plunger contacts with a shoulder region and having an enlarged diameter region within each orifice 70, similar to the first embodiment.

Figure 11:
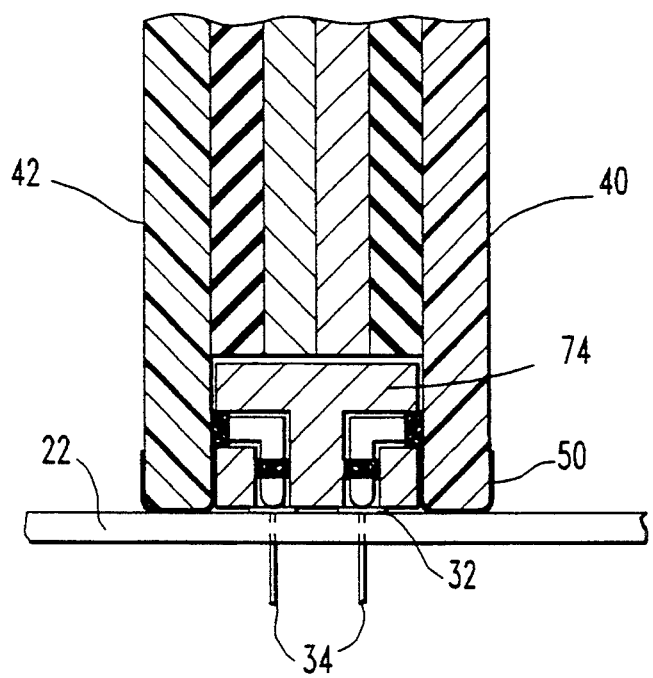
FIG. 11 is fragmentary plan view of an electronic module installed in a backplane assembly utilizing a backplane connector of the second embodiment of the present invention.

In this second embodiment, the backplane connector 88 is preferably mounted on the back edge 48 of a module 18 as shown in FIG. 11. The backplane connector 88 is inserted between the two printed wiring boards 40 and 42 of the module 18 so that each external button spring 62 touches a corresponding terminal 50 on one of the printed wiring boards 40 or 42. As mentioned, the width of the connector body 74 between the second side 76 and the third side 78 is slightly smaller than the distance between the printed wiring boards 40 and 42. More specifically, for the present embodiment, the distance between the outer ends of the button springs 62 is slightly larger than the distance between the printed wiring boards 40 and 42. Upon mounting onto the module 18, the backplane connector 88 is arranged so the protruding button springs 62 touch the corresponding terminals 50. Although terminals 50 that wrap around the end of the back edge 48 of each printed wiring board 40 and 42 as described above for the first embodiment are illustrated, any kind of conductive terminal positioned on the interior surfaces of the printed wiring boards 40 and 42 will suffice.

The insertion of the backplane connector 88 onto the end of a module 18 causes the button springs 62 to depress inwardly in the respective orifices 70 and against the respective internal contacts 84. Due to the resilient characteristics of the button springs 62, the button spring-to-terminal electrical interface is held in elastic compression as a compliant contact. Two mounting holes 64 and 66 extend linearly through the connector body from the first side 72 to a fourth side, substantially parallel to the first side 72. Mechanical attachment of the backplane connector 88 to the heat sink 38 of the module 18 may occur through the use of a bolted assembly, a riveted connection, or the like. Thus, after the backplane connector 88 is assembled to the module 18, the plunger contacts 60 protrude out the end of the module.

When the module 18 is inserted into the mounting guides 24 and installed in the backplane assembly 16, the corresponding plunger contacts 60 and mating pads 32 connect and form a firm interface, as shown in FIG. 11. Similar to the mating described above for the first embodiment, the mounting guide 24 assures proper alignment of the plunger contacts 60 with the corresponding mating pads 32. Pressure on the front edge 68 of the module 18 causes the plunger contacts 60 to depress inwardly in the respective orifices 70 and into the internal button springs 62. The resilient button springs 62 thereby exert an outward force in the respective orifices 70 against the depressed plunger contacts 60 and hold the plunger contact-to-mating pad connection in elastic compression.

Consequently, this second embodiment permits the solder-free connection of a module to a backplane assembly. Low extraction forces due to the mating action of the button springs reduces the need for additional tools. The risk of contact misalignment or contact damage is vastly reduced. Moreover, the backplane connector is attached to the circuit paths of the module without the limitations of plated throughholes. Although this second embodiment has an external button spring 62 that partially protrudes from the connector body 74 and mates with terminals 50, the conductive assembly 82 may alternatively have the external button spring 62 positioned between an internal contact 84 and an additional plunger contact. This additional plunger contact could form the interface with the terminals 50.

Figure 12:
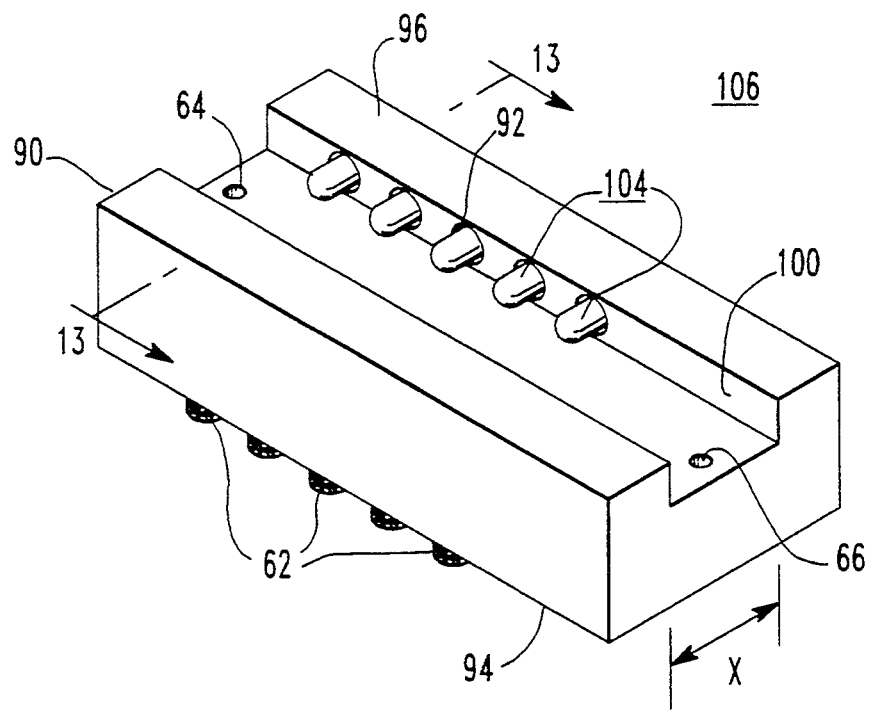
FIG. 12 is a perspective view of a backplane connector according to a third embodiment of the present invention.
Figure 13:
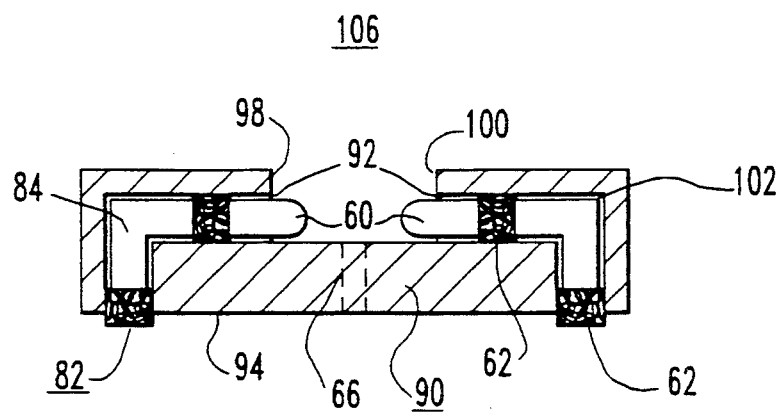
FIG. 13 is a sectional view of the backplane connector of FIG. 12 taken along line 13—13 of FIG. 12.

Referring to FIGS. 12 and 13, a third embodiment of a backplane connector 106 according to the present invention comprises a connector body 90 and a plurality of conductive assemblies 104. The connector body 90 is composed of electrically insulative material and may be manufactured through conventional molded plastic techniques, for example. The connector body 90 is generally rectangular in configuration and has a top side 96 substantially parallel with a bottom or second side 94. Within the top side 96, the connector body 90 contains a central longitudinally extending recess. Thus, the connector body 90 is substantially U-shaped in cross-section. The recess has parallel walls 98 and 100 separated by a distance x slightly larger than the width of the back edge 48 of the electronic module 18. Walls 98 and 100 are substantially perpendicular to the top side 96. The depth of the recess can be approximately half the thickness of the connector body 90.

Two rows of orifices 92, or bores, begin on the second side 94 of the connector body 90. One row of these orifices 92 passes through the interior of the connector body 90 and passes through one wall 98 of the recess in connector body 90, as shown in FIG. 13. The second row of orifices 92 passes through the other wall 100 of the longitudinal recess in the connector body 90. Where the orifices 92 open through the second side 94 of the connector body 90 and through either wall 98 or 100 of the recess, the centerlines of the orifices 92 align substantially perpendicular to the respective side or wall. As a result, the orifices 92 typically form an angle 102 within the connector body 90.

A conductive assembly 82 is located within each orifice 92. As described above, the conductive assembly 82 comprises an internal contact 84, two button springs 62, and one plunger contact 60. The button springs 62 and the plunger contact 60 are arranged differently from the second embodiment, however. In this third embodiment, an external button spring 62 is positioned in each orifice 92 such that this button spring touches one end of the internal contact 84 and also partially protrudes out the second side 94 of the connector body 90, as shown in FIG. 13. An internal button spring 62 is positioned inside each orifice 92 such that this button spring 62 touches the opposite end of the internal contact 84. Each plunger contact 60 is positioned in the end of an orifice 92 nearest the recess such that the plunger contact 60 touches the internal button spring 62 and also partially protrudes out a wall 98 or 100 in the recess. Alternatively, each conductive assembly 82 could have the external button spring 62 positioned between the internal contact 84 and an additional plunger contact. This additional plunger contact would be positioned in each orifice 92 such that it touches the previously external button spring 62 and partially protrudes out the second side 94 of the connector body 90. Retention of the conductive assembly 82 in the connector body 90 may be achieved using techniques detailed above for the first and second embodiments.

In this third embodiment, the backplane connector 106 is preferably mounted to the interior backplane surface 28 of the backplane assembly 16 within one of the connector regions 30. Two mounting holes 64 and 66 extend linearly through the connector body 90 from the second side 94 through the top side 96. The connector body 90 is arranged so that the external button springs 62, which protrude out the second side 94, make contact with the corresponding mating pads 32. Mechanical attachment of the backplane connector 106 to the backplane 22 may occur through the use of a bolted assembly, a riveted combination, or the like. As the mechanical attachment forces the connector body 90 together with the backplane 22, each of the external button springs 62 touching a mating pad 32 depresses inwardly against the internal contact 84 and becomes deformed. Due to the elastic characteristics of the button springs 62, the button springs 62 exert an outward force in the respective orifices 92, and the button spring-to-mating pad electrical interface is held in compression as a firm contact.

Figure 14:
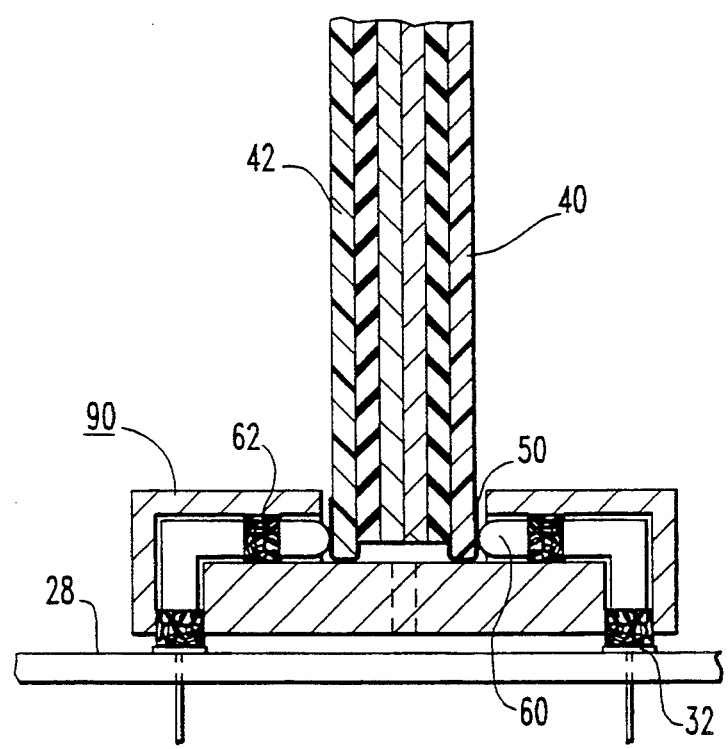
FIG. 14 is a fragmentary view partly in section of an electronic module installed in a backplane assembly utilizing the backplane connector of the third embodiment of the present invention.

FIG. 14 shows the installation of a module in a backplane assembly using the third embodiment of the present invention. Similar to the other embodiments, installation of the module occurs by sliding the module 18 into one of the mounting guides 24. The mounting guides 24 ensure that the terminals 50 on the back edge 48 of the printed wiring boards 40 and 42 align with the corresponding plunger contacts 60 protruding from the backplane connector 106. Pressure on the front edge 68 of the module 18 will force the plunger contacts 60 to depress inwardly in the respective orifices 92 against the internal button springs 62 as the back edge 48 of the module 18 passes into the recess. The button springs 62 will become deformed upon the depression and will exert an outward force on the depressed plunger contacts 60. The urging of the button springs 62 against the depressed plunger contacts 60 forms a compliant electrical interface that is held in elastic compression. Although the preferred terminals 50 provide a solid interface on all sides of the back edge 48 of the printed wiring boards 40 and 42, plated circuit paths on the exterior surface of the boards 40 and 42 will suffice to form a compliant interface with plunger contacts 60 in the third embodiment.

It will be apparent to those skilled in the art that various modifications and variations can be made to the present invention without departing from the spirit or scope of the present invention. For example, the backplane connector body could be dimensioned in additional shapes to meet the customized needs of a module, such as for the connection of individual printed circuit boards. Thus, it is intended that the present invention cover the modifications and variations of this invention provided they come within the scope of the appended claims and their equivalents.

What is claimed is:

1. A backplane assembly, comprising
   a structure having a backplane wall and a mounting wall connected to and extending in planes perpendicular to one another;
   a series of spaced conductive pads mounted to the backplane wall;
   a mounting guide attached to the mounting wall having a longitudinal dimensioning extending substantially perpendicular to the plane of the backplane wall, the mounting guide being a pair of elongate parallel walls positioned perpendicular to the mounting wall to support slidably an electronic module perpendicular to both the mounting wall and the backplane wall;
   an electronic module mounted between the spaced walls of the mounting guide, the module having a series of contact surfaces in alignment with the series of contact pads on the backplane wall;
   an insulative body mounted between the module and the backplane with a first exterior surface opposing the series of contact pads and a second exterior surface opposing the series of contact surfaces, the insulative body having a plurality of orifices, each of the orifices being in registry at opposite ends with the respective opposing contact pads of the backplane and the contact surfaces of the mounted electronic module;
   at least one wadded button spring positioned in each orifice;
   a contact plunger slidably positioned in at least one end of each of the orifice in yielding engagement with at least one of a series of contact pads of the backplane and the series of contact surfaces of the electronic module;
   a retainer securing the module in position in the mounting guides to urge each contact member inwardly in the respective orifice against the wadded button spring; and
   whereby the electronic module is mounted to be in electrical contact with the pads of the backplane through the urging of the wadded button springs.

2. The assembly of claim 1 wherein a contact plunger is positioned in engagement with each opposite ends of the wadded button springs in yielding engagement with both the series of contact pads and the series of contact surfaces.

3. The assembly of claim 1 wherein the plunger members are in yielding engagement with one of the series of contact pads and the series of contact surfaces and the wadded button springs engage the other of the series.

4. The assembly of claim 1 wherein the first exterior surface and the second exterior surface of the insulative member are perpendicular to each other, the at least one wadded button spring comprises two wadded button springs, said assembly further comprising a conductive dog let member mounted in each of the orifices between and engaging the two button springs.

5. A device for electronically connecting an electronic module to a backplane having a series of contact pads, comprising
   an insulative body substantially U-shaped in cross section to define an elongated central recess bounded by parallel walls and having a back surface opposite the recess, a series of orifice means each having a dog leg configuration and longitudinally spaced at one end having a portion opening through at least one of the parallel walls and an opposite portion opening through the back surface at the other end of the orifice means;
   a pair of wadded button springs positioned in each one of the series of orifice means, one of said pair being positioned in the respective orifice means portion opening through the parallel wall and the other being positioned in the orifice means portion opening through the back surface;

a conductive dog leg member positioned between each pair of wadded button springs in the orifice means; and a conductive plunger slidably mounted in each one of the orifices and extending through the parallel wall into the central recess, whereby an electronic module positioned in the elongate recess engages the series of plungers against the urging of one of the pair of springs, and the series of wadded button springs on the back surface is able to electrically engage contact pads on a backplane.

6. A device for electrically connecting a series of contact surfaces of an electronic module to a series of contact pads of a backplane assembly, comprising an insulative body having a first exterior surface for opposing the contact pads and a second exterior surface for opposing the contact surfaces; the insulative body having a series of orifices extending from the first to the second exterior surface;

at least one electrically conductive wadded button spring positioned in each orifice;

at least one series of electrically conductive plungers mounted slidably in each of the orifices extending from one of the first and second exterior surfaces, said series of plungers engaging the wadded button springs, and being urged outwardly of the body by the button springs;

each of the orifices having a portion of lesser diameter to form a shoulder; and at least one outwardly extending finger attached to each plunger and positioned to engage the shoulder to hold the plungers inwardly of the body against the urging of the button springs.

7. A device for electrically connecting a series of contact surfaces of an electronic module to a series of contact pads of a backplane assembly where the contact surfaces are in a plane perpendicular to the contact pads, comprising:

an insulative body having first and second exterior surfaces in planes perpendicular to one another, a series of orifice means open at opposite ends in the respective first and second exterior surfaces, each orifice means being of a dog leg configuration;

a pair of wadded button springs positioned in each of the orifice means;

a conductive member having a dog leg configuration positioned between and in engagement with each of the pair of wadded button springs; and a plunger slidably mounted in each of the series of orifice means opening in at least one of the first and second exterior surfaces, each plunger being urged in an outwardly direction to protrude from the orifice means.

8. The device of claim 7 further comprising a plunger slidably mounted in each of the orifice means in engagement with each of the pair of wadded button springs.

* * * * *